(12) United States Patent
Zhu et al.

(10) Patent No.: US 8,368,127 B2
(45) Date of Patent: Feb. 5, 2013

(54) METHOD OF FABRICATING A SILICON TUNNELING FIELD EFFECT TRANSISTOR (TFET) WITH HIGH DRIVE CURRENT

(75) Inventors: Ming Zhu, Shanghai (CN); Shyue Seng Tan, Singapore (SG); Eng Huat Toh, Singapore (SG); Elgin Quek, Singapore (SG)

(73) Assignee: Globalfoundries Singapore PTE., Ltd., Singapore (SG)

( * ) Notice: Subject to any disclaimer, the term of this patent is extended or adjusted under 35 U.S.C. 154(b) by 249 days.

(21) Appl. No.: 12/587,511

(22) Filed: Oct. 8, 2009

(65) Prior Publication Data

US 2011/0084319 A1   Apr. 14, 2011

(51) Int. Cl.
*H01L 29/76* (2006.01)

(52) U.S. Cl. ......... 257/288; 257/E21.409; 257/E29.255; 438/285

(58) Field of Classification Search ............ 257/288
See application file for complete search history.

(56) References Cited

U.S. PATENT DOCUMENTS

| | | | | |
|---|---|---|---|---|
| 6,207,508 B1 * | 3/2001 | Patel | | 438/268 |
| 6,482,705 B1 * | 11/2002 | Yu | | 438/300 |
| 6,660,603 B2 * | 12/2003 | Mitros | | 438/303 |
| 6,949,787 B2 * | 9/2005 | Snyder et al. | | 257/310 |
| 7,132,322 B1 * | 11/2006 | Greene et al. | | 438/199 |
| 7,446,372 B2 * | 11/2008 | Forbes | | 257/328 |
| 7,482,211 B2 * | 1/2009 | Nieh et al. | | 438/162 |
| 7,504,301 B2 * | 3/2009 | Waite et al. | | 438/255 |
| 7,772,064 B2 * | 8/2010 | Yang | | 438/233 |
| 7,834,345 B2 * | 11/2010 | Bhuwalka et al. | | 257/28 |
| 7,838,372 B2 * | 11/2010 | Han et al. | | 438/300 |
| 7,839,209 B2 * | 11/2010 | Curatola et al. | | 327/566 |
| 2001/0030340 A1 * | 10/2001 | Fujiwara | | 257/314 |
| 2006/0091490 A1 * | 5/2006 | Chen et al. | | 257/458 |
| 2006/0175678 A1 * | 8/2006 | Mitros et al. | | 257/492 |
| 2006/0220064 A1 * | 10/2006 | Joodaki et al. | | 257/197 |
| 2006/0237746 A1 * | 10/2006 | Orlowski et al. | | 257/192 |
| 2006/0258072 A1 * | 11/2006 | Kavalieros et al. | | 438/197 |
| 2006/0258073 A1 * | 11/2006 | Greene et al. | | 438/199 |
| 2006/0278952 A1 * | 12/2006 | Mori et al. | | 257/510 |
| 2007/0001162 A1 * | 1/2007 | Orlowski et al. | | 257/19 |
| 2007/0045741 A1 * | 3/2007 | Forbes | | 257/351 |
| 2007/0178650 A1 * | 8/2007 | Chen et al. | | 438/301 |
| 2007/0228433 A1 * | 10/2007 | Forbes | | 257/296 |
| 2007/0253239 A1 * | 11/2007 | Wang et al. | | 365/154 |
| 2008/0006854 A1 * | 1/2008 | Luo et al. | | 257/288 |

(Continued)

OTHER PUBLICATIONS

Chenming Hu, et al., "Green Transistor—A VDD Scaling Path for Future Low Power ICs," Department of Electrical Engineering and Computer Sciences, University of California, IEEE 2008, 2 pages.

(Continued)

*Primary Examiner* — N Drew Richards
*Assistant Examiner* — Ankush Singal
(74) *Attorney, Agent, or Firm* — Robert D. McCutcheon

(57) ABSTRACT

A method (and semiconductor device) of fabricating a TFET device provides a source region having at least a portion thereof positioned underneath a gate dielectric. In one embodiment, the TFET includes an N+ drain region and a P+ source region in a silicon substrate, where the N+ drain region is silicon and the P+ source region is silicon germanium (SiGe). The source region includes a first region of a first type (e.g., P+ SiGe) and a second region of a second type (undoped SiGe), where at least a portion of the source region is positioned below the gate dielectric. This structure decreases the tunneling barrier width and increases drive current (Id).

16 Claims, 8 Drawing Sheets

U.S. PATENT DOCUMENTS

| | | | |
|---|---|---|---|
| 2008/0050881 A1* | 2/2008 | Chen et al. | 438/301 |
| 2008/0079033 A1* | 4/2008 | Waite et al. | 257/255 |
| 2008/0153225 A1* | 6/2008 | Fang et al. | 438/258 |
| 2008/0185612 A1* | 8/2008 | Fukuda et al. | 257/190 |
| 2008/0224212 A1* | 9/2008 | Lee et al. | 257/344 |
| 2008/0277699 A1* | 11/2008 | Chakravarthi et al. | 257/289 |
| 2008/0315279 A1* | 12/2008 | Forbes | 257/314 |
| 2009/0001484 A1* | 1/2009 | Feudel et al. | 257/408 |
| 2009/0124056 A1* | 5/2009 | Chen et al. | 438/278 |
| 2010/0059737 A1* | 3/2010 | Bhuwalka et al. | 257/28 |
| 2010/0097135 A1* | 4/2010 | Curatola et al. | 327/581 |
| 2010/0244148 A1* | 9/2010 | Chaparala et al. | 257/408 |
| 2010/0301394 A1* | 12/2010 | Shimamune et al. | 257/192 |
| 2011/0042757 A1* | 2/2011 | Tan et al. | 257/402 |

OTHER PUBLICATIONS

F. Mayer, et al., "Impact of SOI Si1-xGexOI and GeOI Substrates on CMOS Compatible Tunnel FET Performance," IEEE 2008, pp. 163-166.

Tejas Krishnamohan, et al., "Double-Gate Strained-Ge Heterostructure Tunneling Fet (TFET) With Record High Drive Currents and <60mV/dec Subthreshold Slope," IEEE 2008, pp. 947-949.

Woo Young Choi, et al., "Tunneling Field-Effect Transistors (TFETs) With Subthreshold Swing (SS) Less Than 60 mV/dec," IEEE 2007, pp. 743-745.

* cited by examiner

OFF STATE
TUNNELING IS
NOT ALLOWED

ON STATE
TUNNELING
IS ALLOWED

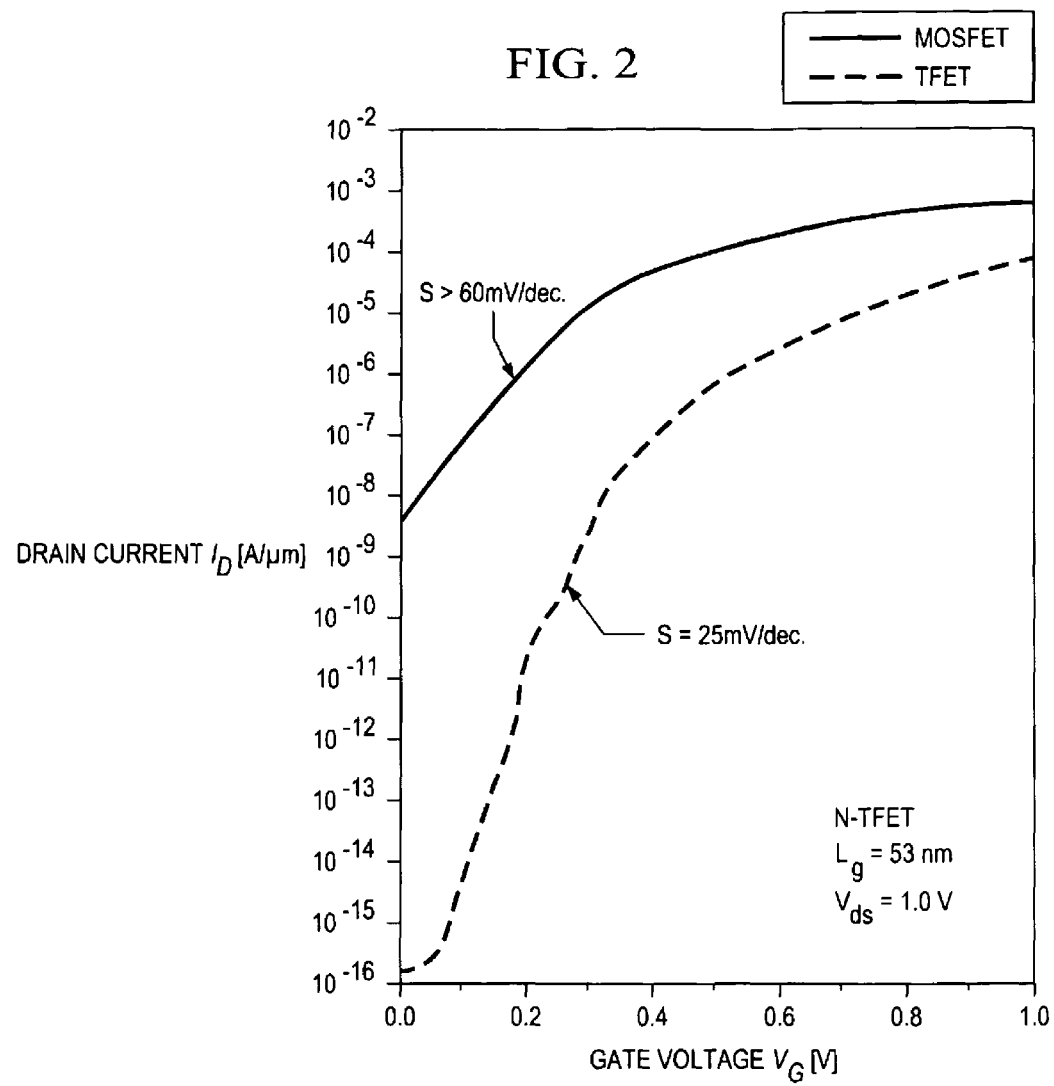

ON-STATE OF A
N-CHANNEL TFET

METHOD OF FABRICATING A SILICON TUNNELING FIELD EFFECT TRANSISTOR (TFET) WITH HIGH DRIVE CURRENT

TECHNICAL FIELD

The present disclosure relates generally to devices and methods of fabrication of semiconductor devices, and more particularly to the fabrication of tunneling field-effect transistors (TFETs) having high drive current.

BACKGROUND

As conventional CMOS transistors are scaled down, power dissipation due to off-state leakage current increases. In an effort to reduce this power consumption, tunneling field effect transistors (TFET) have been proposed because of the extremely low off-state leakage current capability. Additional technical background information regarding TFETs may be found in "Tunneling Field-Effect Transistors (TFETs) With Subthreshold Swing (SS) Less Than 60 mV/dec," Choi, W. Y., et al., IEEE Electron Device Letters, Vol. 28, No. 8, August 2007; "Double-Gate Strained-Ge Heterostructure Tunneling FET (FTET) With Record High Drive Currents and <60 mV/dec Subthreshold Slope," Krishnamohan, Tejas, et al., IEEE 2008; "Impact of SOI, $Si_{1-x}Ge_xOI$ and GeOI Substrates On CMOS Compatible Tunnel FET Performance," Mayer, F., et al., IEEE 2008; and "Green Transistor—A $V_{DD}$ Scaling Path For Future Low Power ICs," Hu, Chenming, et al., IEEE 2008, which are incorporated herein by reference.

Referring to FIG. 1A, there is shown a conventional TFET. Instead of both source and drain regions having the same conductivity type (e.g., P-type or N-type) as done in conventional MOSFETs, the TFET is constructed to include a P+ type drain/source and N+ type source/drain in a substrate. As will be appreciated, a conventional TFET may act as either a p-channel or n-channel depending on the gate voltage value.

Referring to FIGS. 1B and 1C, in the OFF-state, the gage bias voltage (Vgs) is zero with insufficient band bending to allow tunneling. In this state, the leakage current is extremely low and is due to the drift of minority carriers (similar to that of a reverse biased P-I-N diode). In the ON-state (usually with the P+ source grounded and the N+ drain at a fixed positive bias), the gate induces sufficient band bending resulting in a reduction of the tunneling barrier width to less than 5 nanometers (nm). This leads to substantial band-to-band tunneling of electrons from the valence band of the P+ source region to the conduction band of the N+ drain region.

Advantages of conventional TFETs include a sub-60 mV subthreshold slope, low off-state leakage current, control of short channel effects, and an intrinsic channel that minimizes any dopant fluctuation issues. In contrast, the main disadvantage of conventional TFETs is the low drive current because the current originates from band-to-band tunneling. In other words, the drive current (drain current Id) capability of conventional TFETs is much lower than conventional MOSFETs. FIG. 2 illustrates a general comparison of the Id-Vg curves between a conventional TFET and conventional MOSFET.

To increase the drive current, it has been proposed to utilize silicon-germanium (SiGe) in the source region near the tunneling region. FIGS. 3A, 3B and 3C illustrate the typical tunneling width for silicon and SiGe in the source region. As shown in FIG. 3B, the increase in the valence bandgap (Ev) resulting from a SiGe source region decreases/narrows the tunneling barrier width. However, because conventional SiGe processes usually result in a gap or space between the SiGe source region and the gate stack due to an offset spacer, the tunneling barrier width is still determined by the valance bandgap of silicon (in the channel). Inclusion of the spacer gap causes an increase (shown as $L_H$) in the tunnel barrier width—effectively negating most of the benefits gained by utilizing SiGe in the source region.

Accordingly, there is a need for an improved TFET structure (and method of fabricating) having increased drive current capabilities.

SUMMARY

In accordance with one embodiment, there is provided a method of forming a tunneling field effect (TFET) semiconductor device. The method includes providing a substrate comprising a first substrate material and providing a gate structure on the substrate, the gate structure comprising a gate and a gate dielectric. A drain region of a first type is formed adjacent the gate structure and a source region of a second type is formed adjacent the gate structure, wherein at least a portion of the source region is positioned underneath the gate dielectric such that the gate dielectric overlaps the source region.

In accordance with another embodiment, there is provided a tunneling field-effect transistor (TFET) having a substrate, a gate structure on the substrate, the gate structure comprising a gate and a gate dielectric, a drain region of a first type adjacent the gate structure, and a source region of a second type adjacent the gate structure, wherein at least a portion of the source region is positioned underneath the gate dielectric such that the gate dielectric overlaps the source region.

In yet another embodiment there is provided a method of fabricating a tunneling field-effect transistor (TFET) device. The method includes providing a substrate having a first substrate material and forming a gate structure thereon, the gate structure comprising a gate and a gate dielectric. A drain region of a first type is formed adjacent the gate structure and an intermediate source region is formed adjacent the gate structure. At least a portion of the source region is positioned underneath the gate dielectric such that the gate dielectric overlaps the source region. The method includes selectively removing substantially all of the intermediate source region and forming a cavity positioned beneath the gate dielectric and disposed between the substrate and the gate dielectric and exposing a portion of the substrate. A first source region is formed on the exposed portion of the substrate and a second source region is formed above the first source region, with the second region of a second type different from the first type, wherein at least a one of a portion of the first source region and a portion of the second source region is disposed within the cavity.

Other technical features may be readily apparent to one skilled in the art from the following figures, descriptions, and claims.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which:

FIG. 2 illustrates a general comparison of the Id-Vg curves between a conventional TFET and conventional MOSFET;

DETAILED DESCRIPTION

Reducing the tunneling barrier width and increases drive current (i.e., drive current Id). Increasing band-to-band tunneling (BTBT) also increases drive current. It has been determined that various structures and device modifications can be implemented to increase drive current: (1) material having a lower Eg (bandgap voltage) in the tunneling region, (2) an abrupt junction at the tunneling region (for generating a higher E-field with more band bending), (3) high doping concentration in the source region, and (4) positioning the source region closer to the channel.

The present disclosure provides a TFET device (and methods of fabrication) with increased drive current and other performance enhancements. Though these will be described hereinafter, some of the advantages of the present disclosure are directed to the use of silicon channel instead of SiGe (increased reliability), the use of SiGe in the source region (not in drain region), controlling SiGe profile to achieve higher drive current, in-situ doped P+ SiGe source providing an abrupt junction and high source doping concentration, and SiGe source with high Ge content to achieve high drive current. As will be appreciated, not all structures or methods described herein are required to form the TFET of the present disclosure in order to obtain increased drive current (or any other advantages described herein).

Figure 1A:
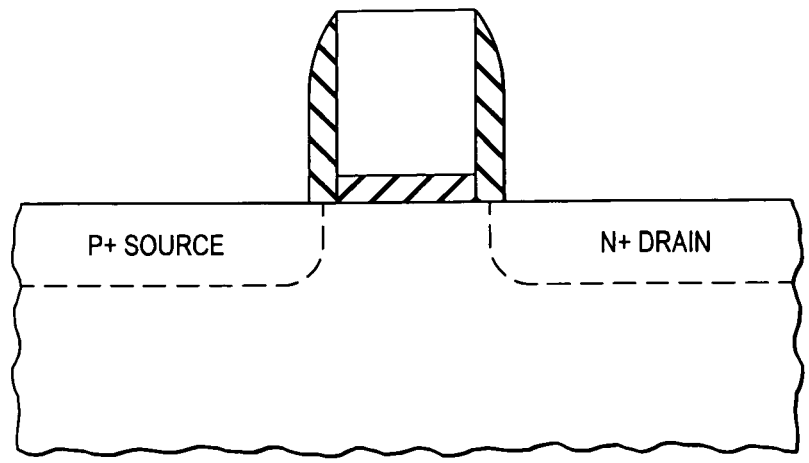
FIGS. 1A, 1B and 1C illustrate a conventional tunneling field effect transistor (TFET) and representations of the OFF and ON states of the TFET, respectively.
Figure 1B:
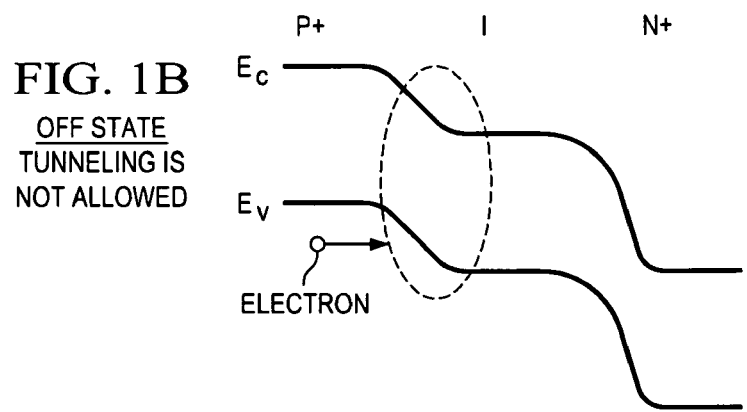
Figure 1C:
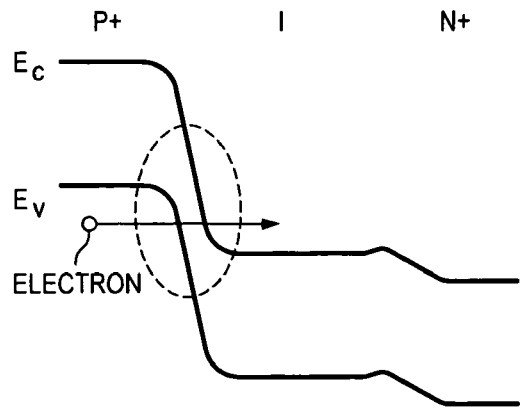
Figure 3A:
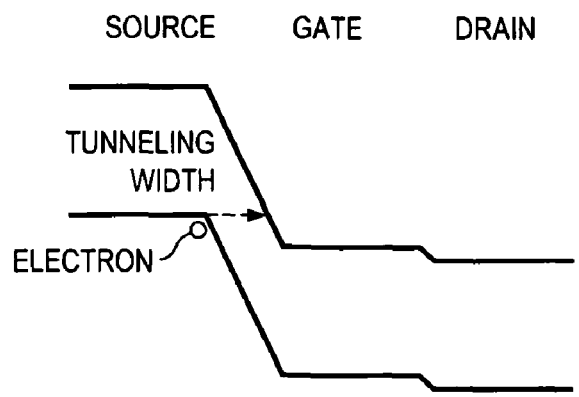
FIGS. 3A, 3B and 3C are diagrams illustrating the difference in tunneling widths for silicon and SiGe in the source region of a TFET.
Figure 3B:
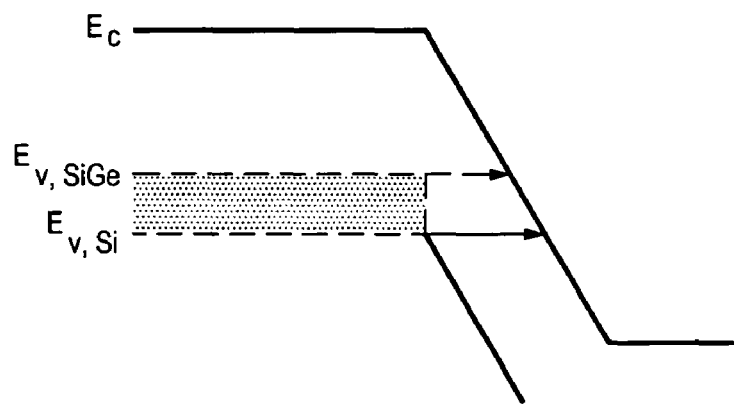
Figure 3C:
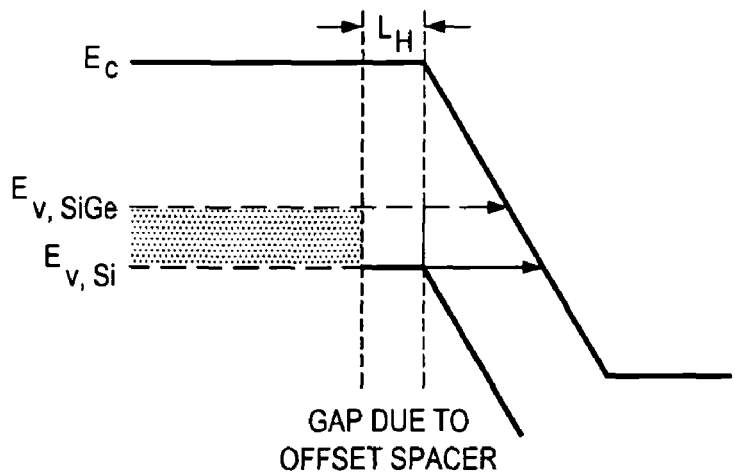
Figure 4:
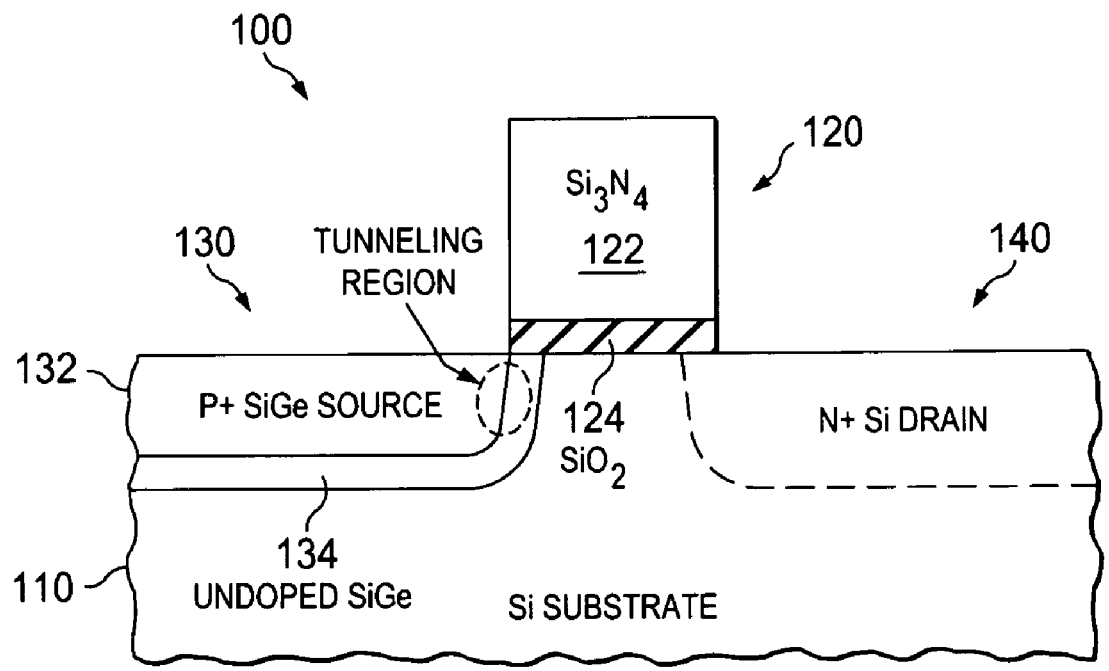
FIG. 4 is a cross-sectional view of TFET in accordance with the present disclosure.

Referring to FIG. 4, there is depicted a cross-sectional view of a TFET device structure 100 formed in or on a substrate 110 in accordance with the present disclosure. The TFET 100 includes the substrate 110, a gate stack 120, a source region 130 and a drain region 140. The gate stack 120 includes a gate 122 and a gate dielectric layer 124. The gate stack 120 may further include sidewall spacers (not shown) and the gate 122 may be formed of polysilicon. As will be appreciated, the structures and regions shown in the FIGURES are not drawn to scale or actual form, and are for illustrative purposes.

In one embodiment, the substrate 110 is silicon, and in other embodiments, it may include, for example, silicon-germanium, silicon-on-insulator (SOI), or other suitable semiconductor substrate materials, now known or later developed. The substrate 110 may include silicon (e.g., n-type, p-type, or no type) provided in a single well or twin-well process, and may further include an epitaxial layer.

In the embodiment shown, the source region 130 is formed of silicon-germanium (SiGe) with p-type dopants (or impurities) and the drain region 140 is formed of silicon (but could be SiGe) with n-type dopants. Further, the source region 130 includes a first source region 134 of a first type and a second source region 132 of a second type. In one embodiment, the first source region 134 is undoped SiGe and the second source region 132 is P+ doped SiGe.

The source region 130 extends to a point that is substantially underneath the gate dielectric layer 122. In one embodiment, the region 130 extends to the edge of the dielectric layer 122 (aligned). In another embodiment, the region 130 extends beyond the edge, and to a point beneath the layer 122 (overlapped). In the overlapped configuration, the gate dielectric layer 122 overlaps or is overlapping the source region 130.

Referring to FIG. 4, although the second source region 134 is shown as being in the overlapped configuration, while the first source region 132 is shown as being aligned with the edge of the gate dielectric layer 122, this is for illustration only. Other configurations may be implemented, for example, in which a portion of the first source region 132 is also disposed beneath the gate dielectric layer 122. The amount of overlap suitable for providing benefits as described herein vary depending on device parameters, such as doping concentration, oxide thickness, gate length. In one embodiment, the source region 130 overlaps with the dielectric layer 122. In another embodiment, the distance of overlap ranges from about 1 nm to about 4 nm. In yet another embodiment, the overlap is about 2 nm.

The positioning of the source region 130 at least partially underneath the gate dielectric layer 122 reduces the tunneling barrier width, thereby leading to a higher drive current. Also shown in FIG. 4 is a dotted circle representing, generally, the tunneling region of the TFET 100.

As will be understood, the TFET 100 may be formed using conventional processes. Moreover, more than one TFET may be fabricated on the substrate.

Now referring to FIGS. 5A-5J, there are shown cross-sectional views of a process in accordance with this disclosure for fabricating or forming the TFET 100. With specific reference to FIG. 2A, there is provided the substrate 110. The gate stack 120 is formed in accordance with well-known semiconductor fabrication techniques. In the embodiment shown, the gate dielectric layer 122 may be silicon oxide and the gate 124 may be silicon nitride; however, other material(s) may be utilized for these structures. As noted previously, sidewall spacers (not shown) may optionally be constructed.

Figure 5A:
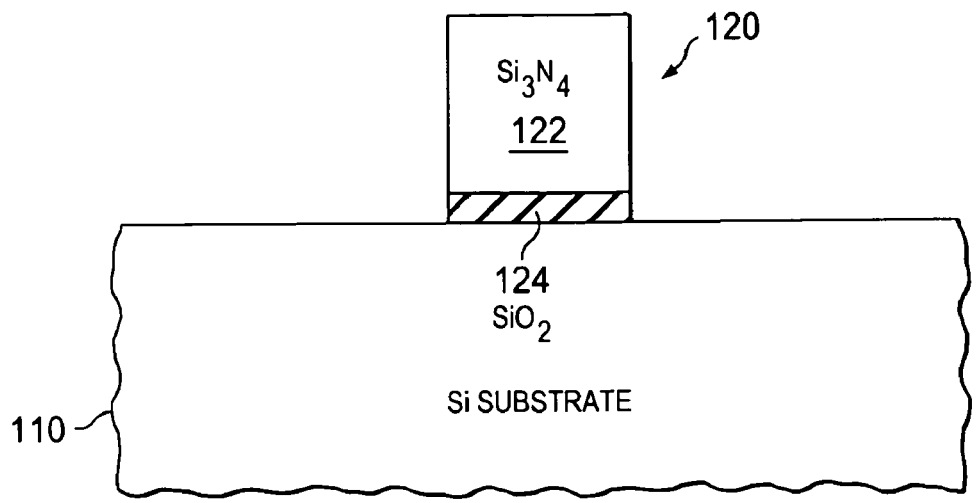
FIGS. 5A-5J are cross-sectional views illustrating various steps of a method or process in accordance with the present disclosure.
Figure 5B:
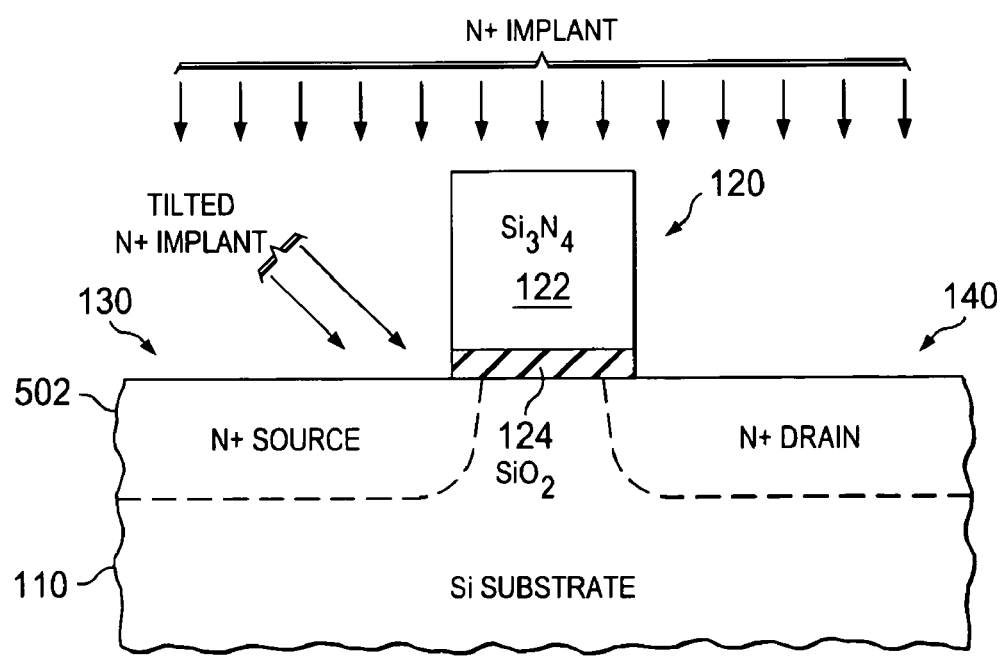

Referring to FIG. 5B, a next step in the process includes doping certain regions of the substrate (these will eventually be the source/drain regions 130, 140 and are shown by dotted lines). N+ dopants are selectively introduced into the substrate 110 to form an intermediate source region 502 and the drain region 140. In one embodiment, the N+ dopants are introduced using implantation; however, alternative doping processes known to those skilled in the art may be utilized. It will be understood additional thermal processing may be performed to diffuse the N+ dopant material within the substrate 110, as desired. In one embodiment, implantation is performed in a substantially vertical direction, with respect to the substrate 110 (i.e., perpendicular to the substrate). In another embodiment, implantation is performed at an angle (i.e., tilted), as shown in FIG. 5B, causing N+ dopants to disperse in a manner that forms at least a portion of the intermediate N+ source region underneath the gate dielectric layer 122. Any suitable angle and power for implantation may be utilized to generate the desired distance of source/channel overlap. In various embodiments, the angle is about 5 degrees or greater, 10 degrees or greater, or may be 20 degrees or greater. In another embodiment, a combination of vertical and tilted implantations may be used.

Figure 5C:
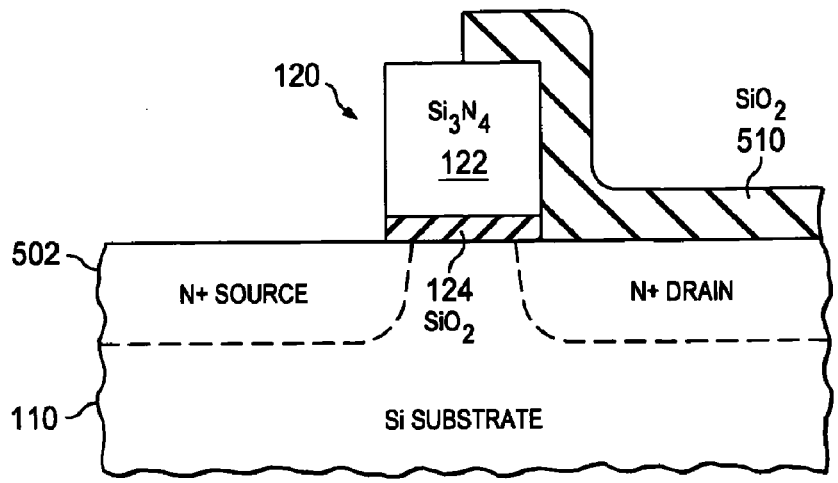
Figure 5D:
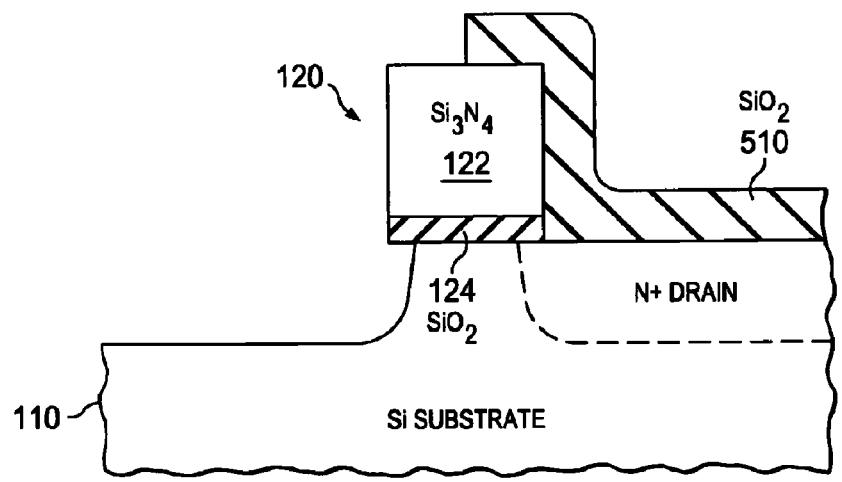

Referring to FIGS. 5C and 5D, a mask layer 510 is formed over the drain region 140, as shown. The mask layer 510 may be a silicon oxide layer. The mask layer 510 is typically formed by depositing oxide over the substrate 110 followed by mask definition and etch (using conventional processes). After the mask layer 510 is formed, the substrate surface is selectively etched to remove the intermediate source drain region 502 (or at least a substantial portion of it). This results in a cavity underneath the gate dielectric layer 122, as shown in FIG. 5D. In other words, the gate dielectric layer 122 overhangs an empty volume positioned between the substrate 110 and the gate dielectric layer 122.

Figure 5E:
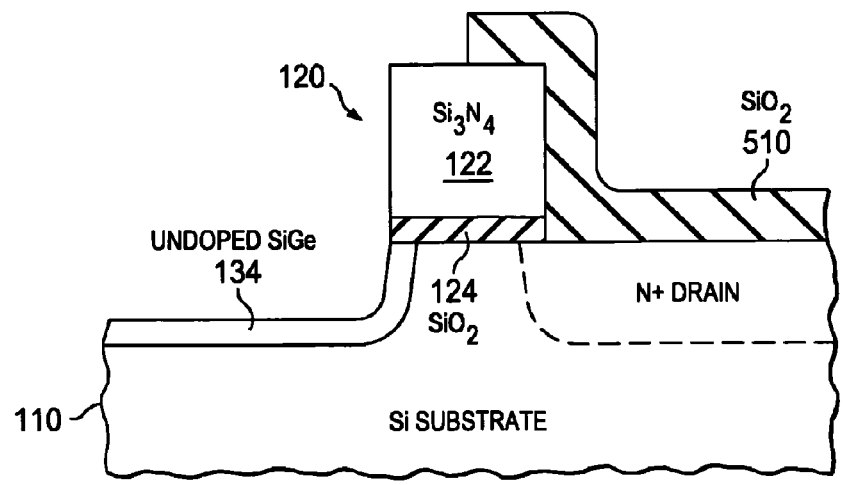

Referring to FIG. 5E, a layer of material is formed on the exposed portion of the substrate 110 (which will eventually form the source region 130). As will be appreciated, this layer of material is the first source region 134 shown in FIG. 4. In one embodiment, the first source region or layer 134 is an epitaxial layer of SiGe formed in-situ. The main purpose of the undoped SiGe layer 132 is to ensure the tunneling region is formed of SiGe. As will be appreciated, the higher the Ge concentration, the lower the tunneling barrier width. In other embodiments, the layer 134 may be formed in a different manner, and may further include different types of material, such as Ge, GeSn or SiGeSn.

Figure 5F:
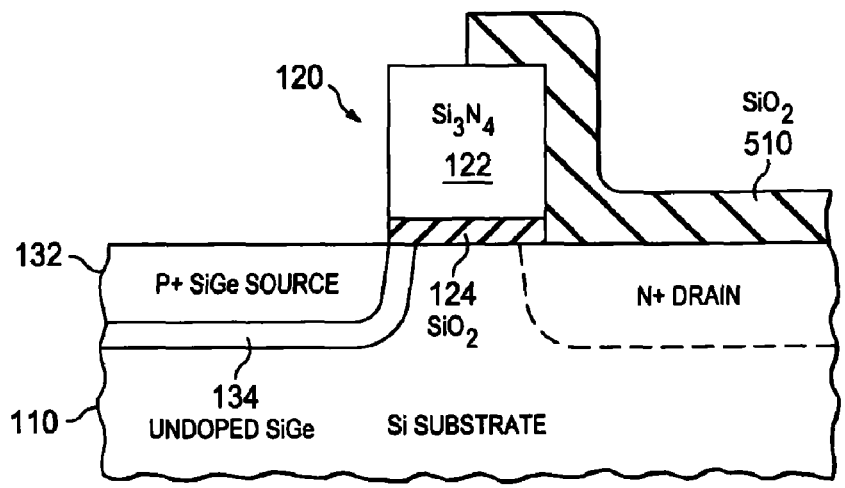

Referring to FIG. 5F, after the first source region layer 134 is formed, another layer of material is formed above the exposed portion of the layer 134 (which together will eventually form source region 130). In one embodiment, the layer 132 is formed on the surface of the layer 134. As will be appreciated, this second layer of material is the second source region 132 shown in FIG. 4. In one embodiment, the second source region or layer 132 is an epitaxial layer of SiGe formed in-situ with P+ species. It is desirable to have a high germanium (Ge) concentration or content within the second source region 132. In one embodiment, the Ge concentration at this formation process is about 30% or higher (e.g., $Si_{0.7}Ge_{0.3}$). Other concentrations of Ge may be used, such as about 20% or higher, or about 15% or higher. However, in the formation of SiGe using a conventional selective epitaxial growth (SEG) process, a concentration higher than about 30% may result in undesirable dislocations.

As will be appreciated, the steps shown in FIGS. 5E and 5F relating to the formation of the SiGe layers 132, 134 (or re-formation of the source region 130) may include additional processing, such as etching to provide the proper profile and thickness to the layers 132, 134. In various embodiments, the thickness of layer 134 is about 5 nm or less, ranges from about 1 nm to about 4 nm, and in yet another embodiment, is about 2 nm.

It will be understood that the formation of the source region 130 into the first source region 134 (undoped SiGe) different from the second source region 132 (P+ SiGe) provides an abrupt junction in the tunneling region. The dopant gradient should be relatively steep.

Figure 5G:
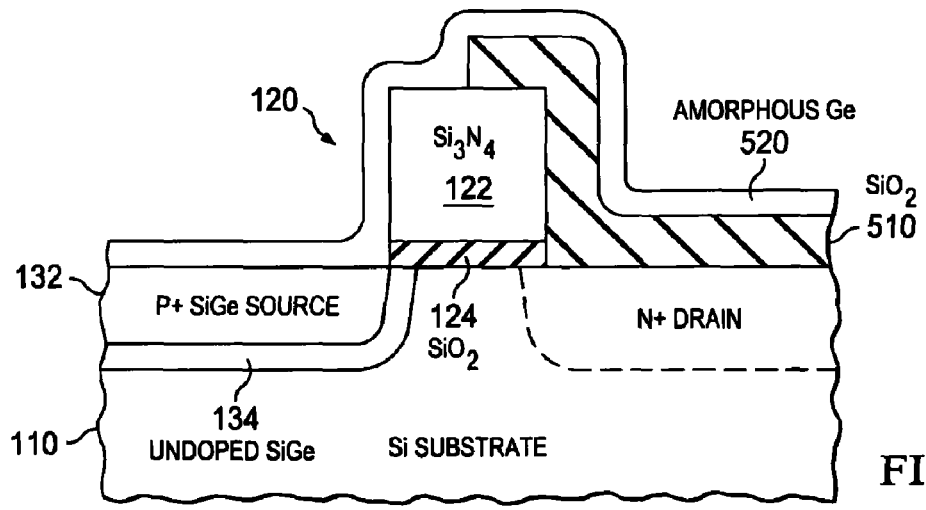
Figure 5H:
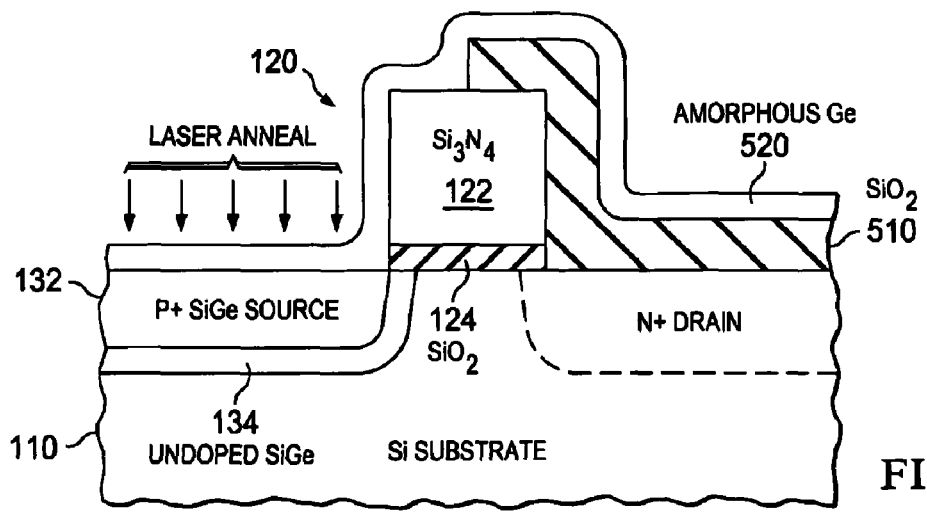

Referring now to FIGS. 5G and 5H, an amorphous germanium layer 520 is formed over at least the source region 130 on the P+ SiGe layer 132. After formation, an anneal process is performed that drives additional germanium into the P+ SiGe second source region 132 to increase the Ge concentration (e.g., greater than 30% when $Si_{0.7}Ge_{0.3}$ is used). In one embodiment, the anneal process is performed using laser irradiation. Laser annealing induces surface melting of both amorphous Ge film and the SiGe layer 132 underneath (a silicon substrate will not melt as its melting point is higher than Ge and SiGe). This process causes inter-diffusion of liquid Ge and silicon and results in a melt having a higher Ge concentration. The melt then re-crystallizes epitaxially with the SiGe layer as a template. The laser anneal process can be controlled to selectively melt the layer 132, but not the layer 134 (or not much) or Si substrate. This may be achieved because the melting point of Ge is lower than that of the layer 132 and the substrate. As a result, the second source region 132 is a P+ SiGe region with a Ge concentration greater than 30%.

Figure 5I:
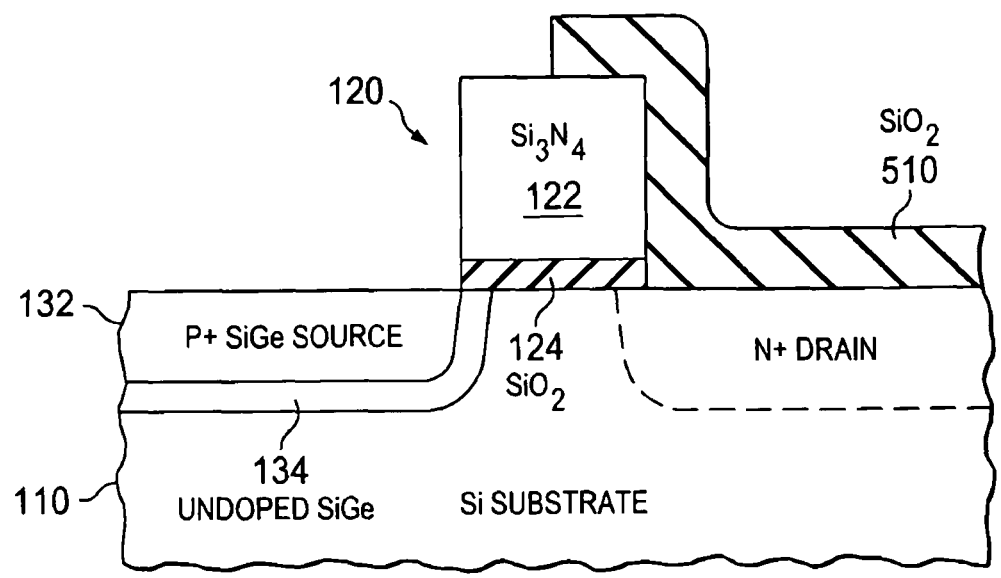
Figure 5J:
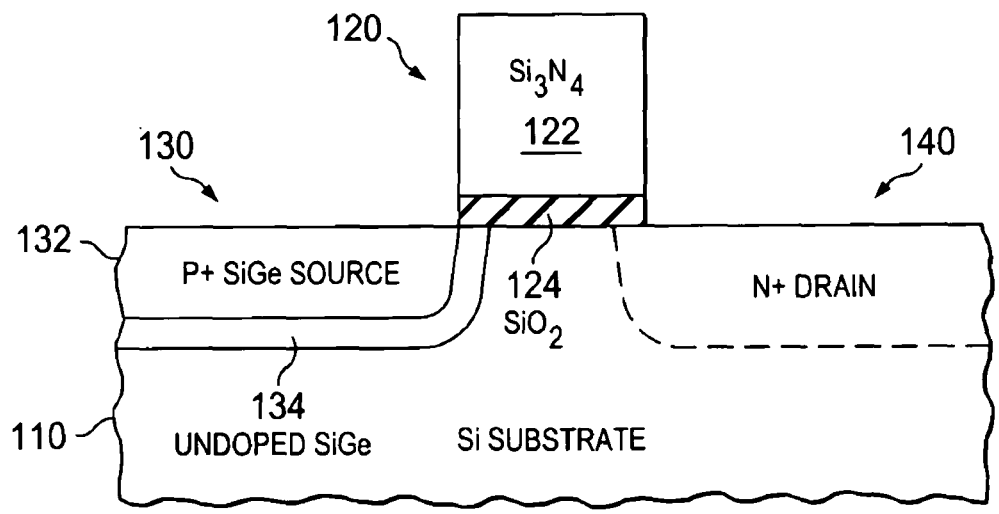

Now turning to FIGS. 5I and 5J, the unreacted Ge layer 520 is removed, and the silicon oxide mask layer 510 is removed. The resulting device is the TFET structure 100 shown in FIG. 4. It will be understood that the gate stack 120 may be a dummy gate stack which can be removed and a replaced with another gate stack.

The order of steps or processing can be changed or varied form that described above. Though not shown, additional devices and structures are typically formed on/in the substrate along with the TFET. It will be understood that well known process have not been described in detail and have been omitted for brevity. Although specific steps, insulating materials, conductive materials and apparatuses for depositing and etching these materials may have been described, the present disclosure may not limited to these specifics, and others may substituted as is well understood by those skilled in the art.

It may be advantageous to set forth definitions of certain words and phrases used throughout this patent document. The terms "include" and "comprise," as well as derivatives thereof, mean inclusion without limitation. The term "or" is inclusive, meaning and/or. The phrases "associated with" and "associated therewith," as well as derivatives thereof, mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method of forming a tunneling field effect (TFET) semiconductor device, the method comprising:
   providing a substrate comprising a first substrate material;
   providing a gate structure on the substrate, the gate structure comprising a gate and a gate dielectric;
   forming a drain region of a first conductivity type adjacent the gate structure;
   forming a source region adjacent the gate structure, wherein at least a portion of the source region is positioned underneath the gate dielectric such that the gate dielectric overlaps the source region, and wherein forming the source region further comprises,
      forming a first source region having a layer of undoped silicon germanium (SiGe), and
      forming above the first source region a second source region having a layer of doped SiGe of a second conductivity type; and
   wherein forming the source region further comprises:
      forming amorphous germanium on a surface of the doped SiGe layer, and
      annealing the amorphous germanium to drive germanium into the doped SiGe layer thereby increasing germanium content of the doped SiGe layer.

2. The method in accordance with claim 1 wherein the substrate and drain region are formed of silicon.

3. The method in accordance with claim 1 wherein forming the second source region comprises epitaxially growing the doped SiGe layer and forming the first source region comprises epitaxially growing the undoped SiGe layer.

4. The method in accordance with claim 1 wherein forming the source region further comprises:
   doping the source region with dopants;

selectively removing substantially all of the doped source region and forming a cavity positioned beneath the gate dielectric and between the substrate and the gate dielectric; and epitaxially re-forming the source region using at least the layer of undoped SiGe and the layer of doped SiGe.

5. The method in accordance with claim 1 wherein the germanium concentration within the doped SiGe layer is less than about 30% prior to annealing and is greater than about 30% after annealing.

6. The method in accordance with claim 3 wherein the germanium concentration within the doped SiGe layer is greater than about 20%.

7. The method in accordance with claim 4 wherein doping the source region further comprises:
  implanting the dopants at an angle such that at least some of the implanted dopants are positioned beneath the gate dielectric.

8. A tunneling field-effect transistor (TFET) comprising:
  a substrate;
  a gate structure on the substrate, the gate structure comprising a gate and a gate dielectric;
  a drain region of a first conductivity type adjacent the gate structure; and
  a source region adjacent the gate structure, wherein at least a portion of the source region is positioned underneath the gate dielectric such that the gate dielectric overlaps the source region, and wherein the source region comprises,
    a first source region having a layer of undoped silicon germanium (SiGe), and
    a second source region having a layer of doped SiGe of a second conductivity type and disposed above the undoped SiGe layer.

9. The TFET in accordance with claim 8 wherein the substrate and drain region are formed of silicon.

10. The TFET in accordance with claim 8 wherein the germanium concentration within the doped SiGe layer is greater than about 30%.

11. The TFET in accordance with claim 8 wherein the undoped SiGe layer comprises undoped epitaxial SiGe and the doped SiGe layer comprises epitaxial SiGe having P-type dopants.

12. A method of fabricating a tunneling field-effect transistor (TFET) device, the method comprising:
  providing a substrate comprising a first substrate material;
  forming a gate structure on the substrate, the gate structure comprising a gate and a gate dielectric;
  forming a drain region of a first conductivity type adjacent the gate structure; and
  forming an intermediate source region adjacent the gate structure, wherein at least a portion of the source region is positioned underneath the gate dielectric such that the gate dielectric overlaps the source region;
  selectively removing substantially all of the intermediate source region and forming a cavity positioned beneath the gate dielectric and disposed between the substrate and the gate dielectric and exposing a portion of the substrate;
  forming on the exposed portion of the substrate a first source region;
  forming above the first source region a second source region of a second conductivity type different from the first conductivity type;
  wherein at least a one of a portion of the first source region and a portion of the second source region is disposed within the cavity;
  wherein the first substrate material is silicon, the drain region is silicon, and the first source region and the second source region comprise silicon germanium (SiGe);
  wherein forming the first source region further comprises epitaxially forming an undoped SiGe layer, and wherein forming the second source region further comprises epitaxially forming a doped layer of silicon germanium (SiGe);
  forming amorphous germanium on a surface of the doped SiGe layer; and
  annealing the amorphous germanium to drive germanium into the doped SiGe layer thereby increasing germanium content of the doped SiGe layer.

13. The method in accordance with claim 12 wherein the germanium concentration within the doped SiGe layer is less than about 30% prior to annealing and is greater than about 30% after annealing.

14. A method of forming a tunneling field effect (TFET) semiconductor device, the method comprising:
  providing a substrate comprising a first substrate material;
  providing a gate structure on the substrate, the gate structure comprising a gate and a gate dielectric;
  forming a drain region of a first conductivity type adjacent the gate structure;
  forming a source region adjacent the gate structure, wherein at least a portion of the source region is positioned underneath the gate dielectric such that the gate dielectric overlaps the source region, and wherein forming the source region further comprises,
    forming a first source region having a layer of undoped silicon germanium (SiGe), and
    forming above the first source region a second source region having a layer of doped SiGe of a second conductivity type;
  wherein forming the source region further comprises:
    doping the source region with dopants,
    selectively removing substantially all of the doped source region and forming a cavity positioned beneath the gate dielectric and between the substrate and the gate dielectric, and
    epitaxially re-forming the source region using at least the layer of undoped SiGe and the layer of doped SiGe; and
  wherein forming the source region further comprises:
    forming amorphous germanium on a surface of the doped SiGe layer, and
    annealing the amorphous germanium to drive germanium into the doped SiGe layer thereby increasing germanium content of the doped SiGe layer.

15. The method in accordance with claim 14 wherein the germanium concentration within the doped SiGe layer is less than about 30% prior to annealing and is greater than about 30% after annealing.

16. A tunneling field-effect transistor (TFET) comprising:
  a silicon substrate;
  a gate structure on the substrate, the gate structure comprising a gate and a gate dielectric;
  a drain region of a first conductivity type adjacent the gate structure; and
  a source region adjacent the gate structure, wherein at least a portion of the source region is positioned underneath the gate dielectric such that the gate dielectric overlaps the source region, and wherein the source region comprises,
a first source region having a layer of undoped silicon germanium (SiGe), at least a a portion of the first source region positioned underneath the gate dielectric, and
a second source region having a layer of doped SiGe of a second conductivity type and disposed above the undoped SiGe layer.

* * * * *